(12) United States Patent
Lii et al.

(10) Patent No.: US 8,970,001 B2
(45) Date of Patent: Mar. 3, 2015

(54) GUARD RING DESIGN FOR MAINTAINING SIGNAL INTEGRITY

(71) Applicant: Taiwan Semiconductor Manufacturing Company, Ltd., Hsin-Chu (TW)

(72) Inventors: Mirng-Ji Lii, Sinpu Township (TW); Hao-Yi Tsai, Hsin-Chu (TW); Hsien-Wei Chen, Hsin-Chu (TW); Hung-Yi Kuo, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 83 days.

(21) Appl. No.: 13/729,389

(22) Filed: Dec. 28, 2012

(65) Prior Publication Data

US 2014/0183690 A1 Jul. 3, 2014

(51) Int. Cl.
*H01L 23/58* (2006.01)
*H01L 23/31* (2006.01)
*H01L 23/522* (2006.01)
*H01L 23/00* (2006.01)

(52) U.S. Cl.
CPC .......... *H01L 23/3192* (2013.01); *H01L 23/585* (2013.01); *H01L 23/5223* (2013.01); *H01L 23/5227* (2013.01); *H01L 24/03* (2013.01); *H01L 24/05* (2013.01); *H01L 24/13* (2013.01); *H01L 24/16* (2013.01); *H01L 2224/0345* (2013.01); *H01L 2224/0401* (2013.01); *H01L 2224/05666* (2013.01); *H01L 2224/05681* (2013.01); *H01L 2224/13082* (2013.01); *H01L 2224/131* (2013.01); *H01L 2224/13147* (2013.01); *H01L 2224/13155* (2013.01); *H01L 2224/13164* (2013.01); *H01L 2224/16225* (2013.01); *H01L 2224/94* (2013.01); *H01L 2924/10253* (2013.01); *H01L 2924/10271* (2013.01); *H01L 2924/10272* (2013.01); *H01L 2924/1032* (2013.01); *H01L 2924/19041* (2013.01); *H01L 2924/19042* (2013.01); *H01L 2924/19104* (2013.01); *H01L 2224/05572* (2013.01); *H01L 2224/13464* (2013.01); *H01L 2224/13455* (2013.01); *H01L 23/5225* (2013.01)
USPC .......................................... 257/531; 257/776

(58) Field of Classification Search
USPC .................................. 257/127, 409, 484, 531
See application file for complete search history.

(56) References Cited

U.S. PATENT DOCUMENTS

| | | | | |
|---|---|---|---|---|
| 6,879,019 B2 * | 4/2005 | Windlass et al. | ............. | 257/529 |
| 6,967,407 B2 * | 11/2005 | Otani et al. | .................... | 257/759 |
| 7,148,089 B2 * | 12/2006 | Hung et al. | .................... | 438/132 |
| 7,271,090 B2 * | 9/2007 | Windlass et al. | ............. | 438/638 |
| 8,253,523 B2 * | 8/2012 | Lee | ................ | 336/200 |
| 8,293,545 B2 * | 10/2012 | Cong et al. | ...................... | 438/14 |
| 8,310,034 B2 * | 11/2012 | Uchida et al. | ................ | 257/659 |
| 8,421,188 B2 * | 4/2013 | Uchida et al. | ................ | 257/531 |
| 8,716,832 B2 * | 5/2014 | Kerber | ......................... | 257/531 |
| 2004/0262763 A1 * | 12/2004 | Windlass et al. | ............. | 257/758 |

(Continued)

*Primary Examiner* — Earl Taylor
(74) *Attorney, Agent, or Firm* — Slater & Matsil, L.L.P.

(57) ABSTRACT

A structure includes a metal feature, and a passivation layer having a portion overlapping the metal feature. The passivation layer includes a non-low-k dielectric material. A polymer layer is over the passivation layer. A Post-Passivation Interconnect (PPI) extends into the polymer layer to electrically couple to the metal feature. A guard ring includes a second PPI, wherein the guard ring is electrically grounded. The second PPI substantially encircles the first PPI.

20 Claims, 8 Drawing Sheets

(56) References Cited

U.S. PATENT DOCUMENTS

| | | |
|---|---|---|
| 2005/0189612 A1* | 9/2005 | Hung et al. .................... 257/529 |
| 2005/0194692 A1* | 9/2005 | Windlass et al. ............. 257/774 |
| 2005/0247999 A1* | 11/2005 | Nishikawa et al. ........... 257/531 |
| 2009/0057922 A1* | 3/2009 | Lee et al. ...................... 257/778 |
| 2010/0193904 A1* | 8/2010 | Watt et al. ..................... 257/531 |
| 2012/0273917 A1* | 11/2012 | Wahl et al. .................... 257/503 |
| 2012/0275480 A1* | 11/2012 | Koike ........................... 372/50.1 |
| 2013/0075859 A1* | 3/2013 | Kerber .......................... 257/531 |
| 2013/0075861 A1* | 3/2013 | Kerber et al. ................. 257/531 |

\* cited by examiner

GUARD RING DESIGN FOR MAINTAINING SIGNAL INTEGRITY

BACKGROUND

In integrated circuit applications, more and more functions are integrated into products. For example, different functional elements such as 3G video elements, WiFi elements, Bluetooth elements, and audio/video elements may need to be integrated together to form an application. A commonly known application for these devices is the mobile application, in which mobile devices such as cell phones are formed.

Radio Frequency (RF) devices such as inductors are widely used in the mobile applications. The inductors may need to adapt to high frequencies when used in the mobile applications. For example, the Q factors of the inductors need to be high to reduce the likely high loss in high-frequency applications.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A guard ring structure for reducing signal interference is provided in accordance with some embodiments. The variations of the embodiments are discussed. Throughout the various views and illustrative embodiments, like reference numbers are used to designate like elements.

Figure 1:
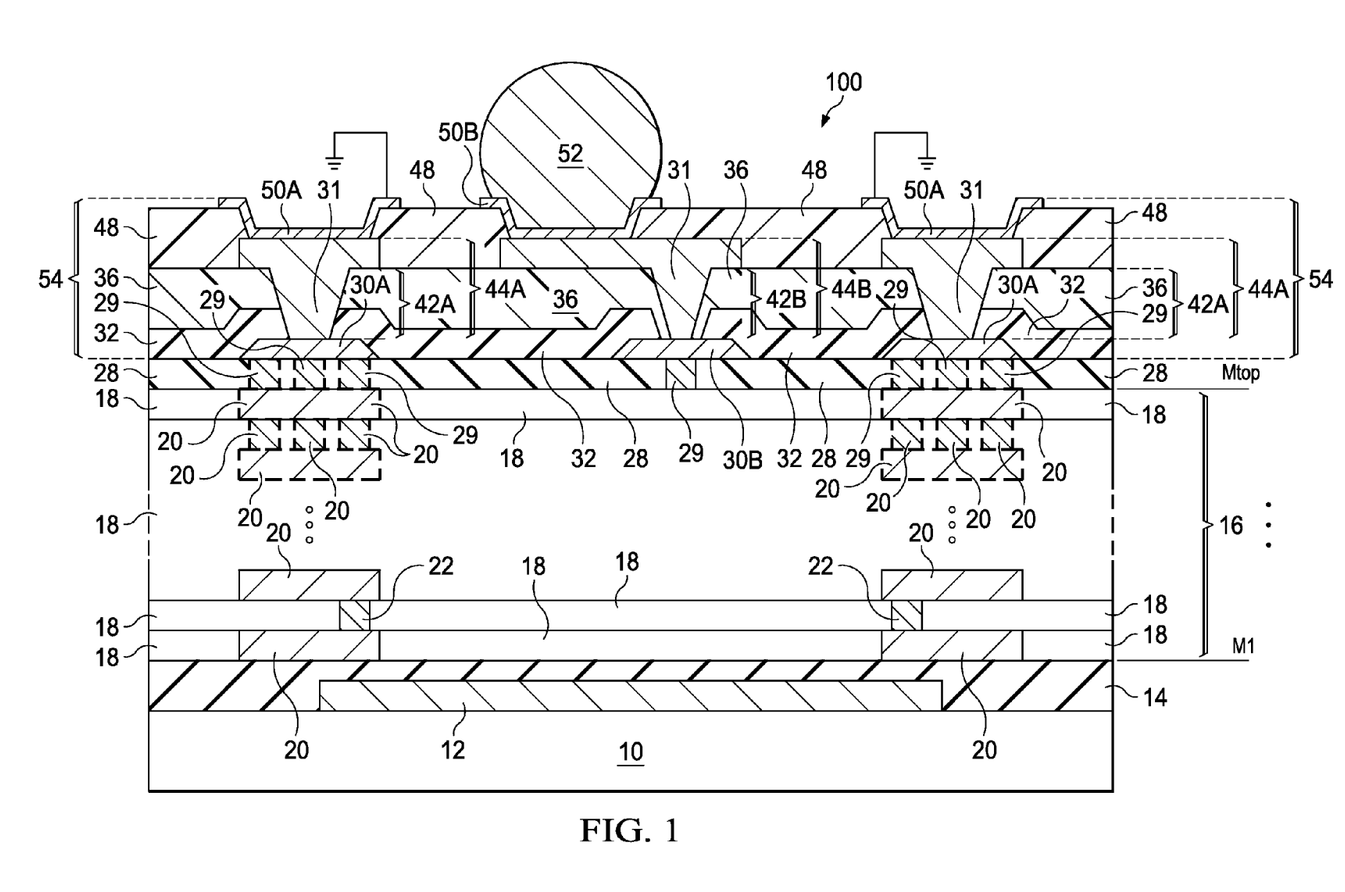
FIGS. 1 through 3 are cross-sectional views of package components in accordance with various exemplary embodiments, wherein guard rings are formed in the package components.

Referring to FIG. 1, wafer 100, which includes semiconductor substrate 10, is provided. Semiconductor substrate 10 may be a bulk silicon substrate or a silicon-on-insulator substrate. Alternatively, other semiconductor materials that include group III, group IV, and group V elements may also be used, which may include silicon germanium, silicon carbon, and III-V compound semiconductor materials. Integrated circuit devices such as transistors (schematically illustrated as 12) are formed in and/or on semiconductor substrate 10. Wafer 100 may further include Inter-Layer Dielectric (ILD) 14 over semiconductor substrate 10, and interconnect structure 16 over ILD 14. Interconnect structure 16 is formed over ILD 14, and includes metal lines 20 and vias 22, which are formed in dielectric layers 18. The combination of metal lines 20 at a same level is referred to a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In some embodiments, dielectric layers 18 are formed of low-k dielectric materials. The dielectric constants (k values) of the low-k dielectric materials may be less than about 3.0, or less than about 2.5, for example.

The metal layers include a bottom metal layer (M1) through a top metal layer (Mtop). In some embodiments, the Mtop layer is the topmost metal layer that is formed in low-k dielectric materials.

In some embodiments, passivation layer 28 is formed over top metal layer Mtop and the respective dielectric layer 18, in which metal layer Mtop is located. Passivation layer 28 has a k value greater than 3.8, and is formed using a non-low-k dielectric material. In some embodiments, passivation layer 28 is a composite layer comprising a silicon oxide layer (not shown), and a silicon nitride layer (not shown) over the silicon oxide layer. Passivation layer 28 may also be formed of other non-porous dielectric materials such as Un-doped Silicate Glass (USG), silicon oxynitride, and/or the like. Vias 29 may be formed in passivation layer 32, and may be electrically coupled to integrated circuit devices 12.

Metal pads 30A and 30B are formed over passivation layer 28. Metal pad 30B may be electrically coupled to integrated circuit devices 12 through metal lines 20 and vias 22. Metal pads 30A and 30B may be aluminum pads or aluminum-copper pads, although other metallic materials may be used. Furthermore, metal pad 30A, although referred to as a pad, may have the top-view shape of a straight strip, a curved strip, a partial ring, a full ring, or the like, with some of the top-view shapes shown in FIGS. 4, 9, and 10.

Passivation layer 32 is formed over passivation layer 28. The material of passivation layer 32 may be selected from the same candidate materials of passivation layer 28. Passivation layers 28 and 32 may be formed of a same dielectric material, or may be formed of different dielectric materials. In some embodiments, passivation layer 32 includes a silicon oxide layer (not shown), and a silicon nitride layer (not shown) over the silicon oxide layer. Passivation layer 32 is patterned, so that portions of passivation layer 32 cover the edge portions of metal pads 30A and 30B, and central portions of metal pads 30A and 30B are exposed through the openings in passivation layer 32.

Polymer layer 36 is formed over passivation layer 32. Polymer layer 36 may comprise a polymer selected from polyimide, BenzoCycloButene (BCB), PolyBenzOxazole (PBO), and/or the like. The formation methods may include spin coating, for example. Polymer layer 36 may be dispensed as a liquid form, and then cured.

Polymer layer 36 is patterned to form openings (occupied by Post-Passivation Interconnect (PPI) vias 42A and 42B) aligned to metal pads 30A and 30B. In some embodiments, metal pad 30A forms a ring, and the openings that are aligned to metal pad 30A may also have a ring shape, which overlaps the ring of metal pad 30A. In alternative embodiments, metal pad 30A forms a ring, and the openings in polymer layer 36 include a plurality of discrete openings that are aligned to the ring of metal pad 30A. In the embodiments that polymer layer 36 is formed of a photo-sensitive material, polymer layer 36 is patterned by exposed to light through a lithography mask (not shown). The exposed polymer layer 36 is then developed to form the openings.

PPIs 44A and 44B are formed after openings are formed in polymer layer 36, wherein PPIs 44A and 44B are such named since the formation of PPIs 44A and 44B is after the formation of passivation layer 32. In some embodiments, the formation of PPIs 44A and 44B includes depositing a seed layer (not shown), forming a patterning mask (not shown) over the seed layer, and plating a metallic material (not shown) over the seed layer. The mask layer is then removed, and the portions of the seed layer covered by the mask layer are removed. The remaining portions of the seed layer and the metallic material form PPIs 44A and 44B.

PPI 44A includes PPI via 42A, which is in the opening in polymer layer 36, and a portion overlying polymer layer 36. PPI via 42A may be in physical contact with metal pad 30A to form interface 31, which may also have a top-view shape of a ring. Similarly, PPI via 42A may have a top-view shape of a ring, or may include a plurality of discrete vias that is separate from each other. PPI 44B includes PPI via 42B, which is in the opening in polymer layer 36, and a portion overlying polymer layer 36. PPI via 42B may be in physical contact with metal pad 30B.

FIG. 1 further illustrates the formation of polymer layer 48 and Under-Bump-Metallurgies (UBMs) 50A and 50B. In the respective formation process, polymer layer 48 is first formed over polymer layer 36 and PPIs 44A and 44B. Polymer layer 48 may be formed of a material selected from the same group of candidate materials for forming polymer layer 36. For example, polymer layer 48 may comprise polyimide or another polymer-based material such as PBO, BCB, or the like. Polymer layer 48 may be formed using spin coating, followed by a curing process.

Next, UBMs 50A and 50B are formed. In some embodiments, each of UBMs 50A and 50B includes a barrier layer (not shown) and a seed layer (not shown) over the barrier layer. UBMs 50A and 50B extend into the openings in polymer layer 48, and are electrically coupled to, and may be in physical contact with, PPI 44A and 44B, respectively. The barrier layer may be a titanium layer, a titanium nitride layer, a tantalum layer, a tantalum nitride layer, or a layer formed of other titanium alloys or tantalum alloys. The materials of the seed layer may include copper or copper alloys. The seed layer and the barrier layer may be formed using PVD or other applicable methods. In some embodiments, UBM 50A forms a ring, which overlaps the ring of PPI 44A and the ring of metal pad 30A. In alternative embodiments, UBM 50A includes a plurality of discrete UBMs that are over and in contact with the same PPI 44A, which may be a ring in these embodiments.

Over UBM 50B, connector 52 is formed. In some embodiments, connector 52 includes a metal region, which is either a metal ball, such as a solder ball or a copper ball, placed on UBM layer 50, or a metal pillar formed on UBM layer 50 through plating. The metal region may then go through a reflow process, and connector 52 is formed as a solder ball. In alternative embodiments, connector 52 comprises a metal pillar, which may be a copper pillar. Additional layers such as a nickel layer, a solder cap, a palladium layer, and the like, may also be formed on the metal pillar. In some embodiments, no connector is formed to overlap UBM 50A when connector 52 is formed. In alternative embodiments, a connector (not shown) is formed simultaneously as the formation of connector 52, wherein the connector over UBM 50A may also form a ring. Throughout the description, the structure including UBM 50A, PPI 44A, and metal pad 30A are referred to as guard ring 54. If any connector is formed over UBM 50A, the connector also forms a part of guard ring 54.

In some embodiments, connector 52 is electrically coupled to integrated circuit devices 12 through underlying UBM 50B, PPI 44B, metal pad 30B, and the underlying metal lines 20 and vias 22. When wafer 100 is sawed into dies and the dies are packaged, connector 52 is bonded to another package component (not shown) such as a package substrate, an interposer, a printed circuit board, or the like. In the used of the respective package, electrical signals are transmitted through connector 52, UBM 50B, PPI 44B, and metal pad 30B. Accordingly, guard ring 54 may be electrically grounded to insulate the structure within guard ring 54 and the structure outside guard ring 54 from each other. The signal interference between the signals within guard ring 54 and the signals outside guard ring 54 is thus reduced, and signal integrity may be maintained.

Figure 4:
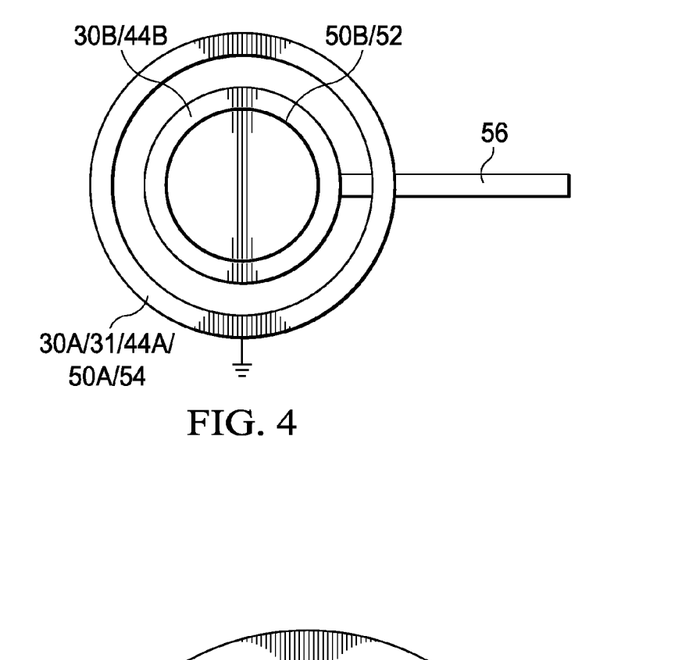
FIG. 4 illustrates a top view of the structure in FIGS. 1 through 3 in accordance with exemplary embodiments.

FIG. 4 illustrates a top view of a portion of the structure in FIG. 1. In accordance with some embodiments, as shown in FIG. 4, guard ring 54 forms a full ring encircling connector 52, UBM 50B, PPI 44B, and metal pad 30B. The interface 31 between UBM 50A and PPI 44A may also have a ring shape in the top view shown in FIG. 4. Although FIG. 4 illustrates that guard ring 54 forms a circular ring, guard ring 54 may also have other top-view shapes including, and not limited to, rectangles, hexagons, octagons, and the like. The electrical connection to connector 52, UBM 50B, PPI 44B, and metal pad 30B may include metal line 56, which crosses guard ring 54 at a level lower than the level (referred to as an aluminum level hereinafter) of metal pads 30A and 30B, wherein the aluminum level is shown in FIG. 1. In alternative embodiments in which guard ring 54 does not include metal pad 30A, metal line 56 may be at the aluminum level.

Figure 2:
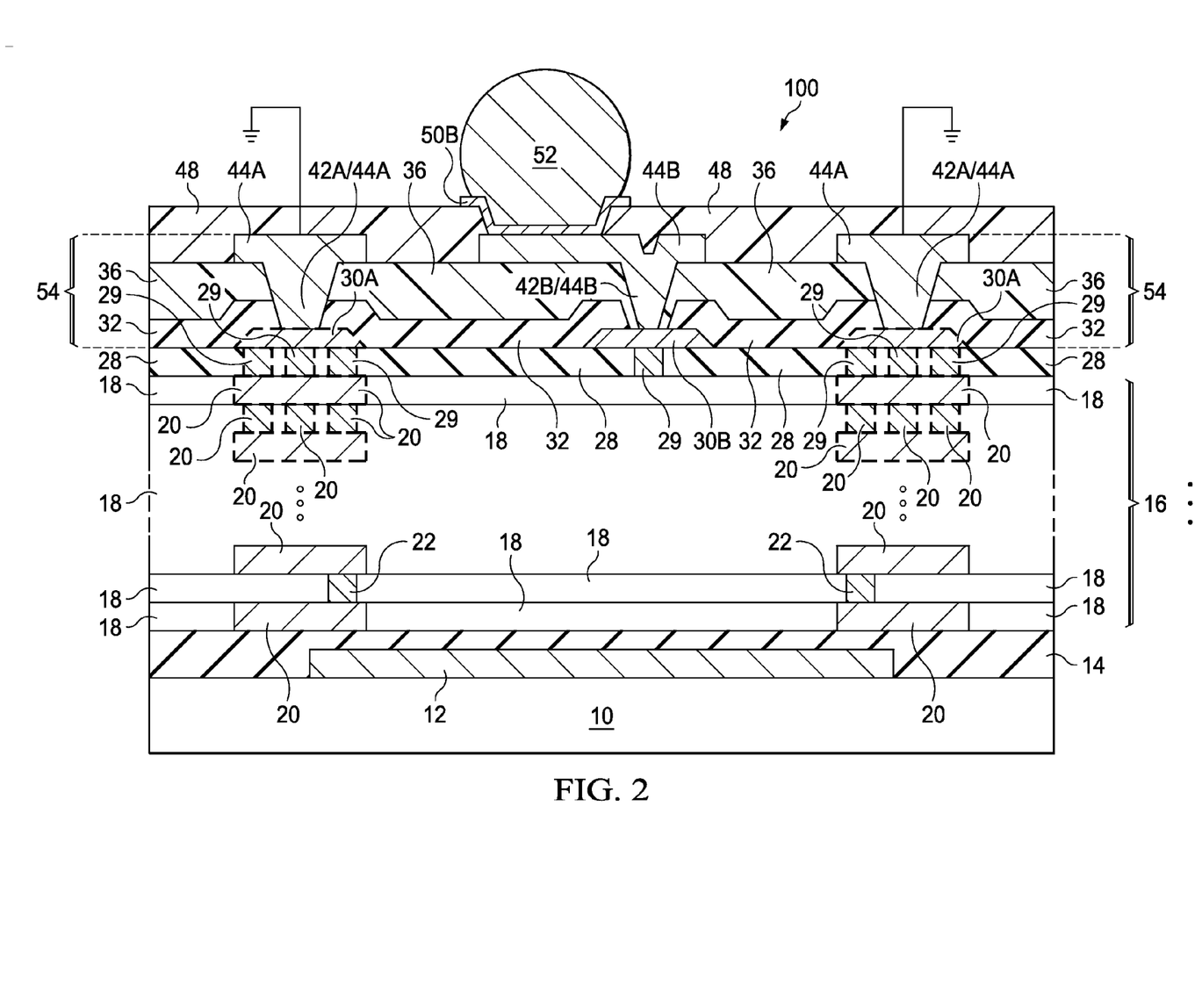

FIG. 2 illustrates the cross-sectional view of guard ring 54 in accordance with alternative embodiments. Unless specified otherwise, the materials and the formation methods of the components in these embodiments (and the embodiments in FIGS. 3 through 10) are essentially the same as the like components, which are denoted by like reference numerals in the embodiments shown in FIGS. 1 and 4. The details regarding the formation process and the materials of the components shown in FIGS. 2 through 10 may thus be found in the discussion of the embodiments shown in FIGS. 1 and 4.

FIG. 2 is similar to the embodiments in FIG. 1, except that guard ring 54 does not extend to the UBM level, which is the level in which UBM 50B is located. Guard ring 54 includes PPI 44A. In some embodiments, guard ring 54 further includes metal pad 30A, which also forms a ring. In alternative embodiments, guard ring 54 does not include metal pad 30A. Guard ring 54 is covered by polymer layer 48, and is not exposed. Again, guard ring 54 may be electrically grounded in these embodiments.

Figure 3:
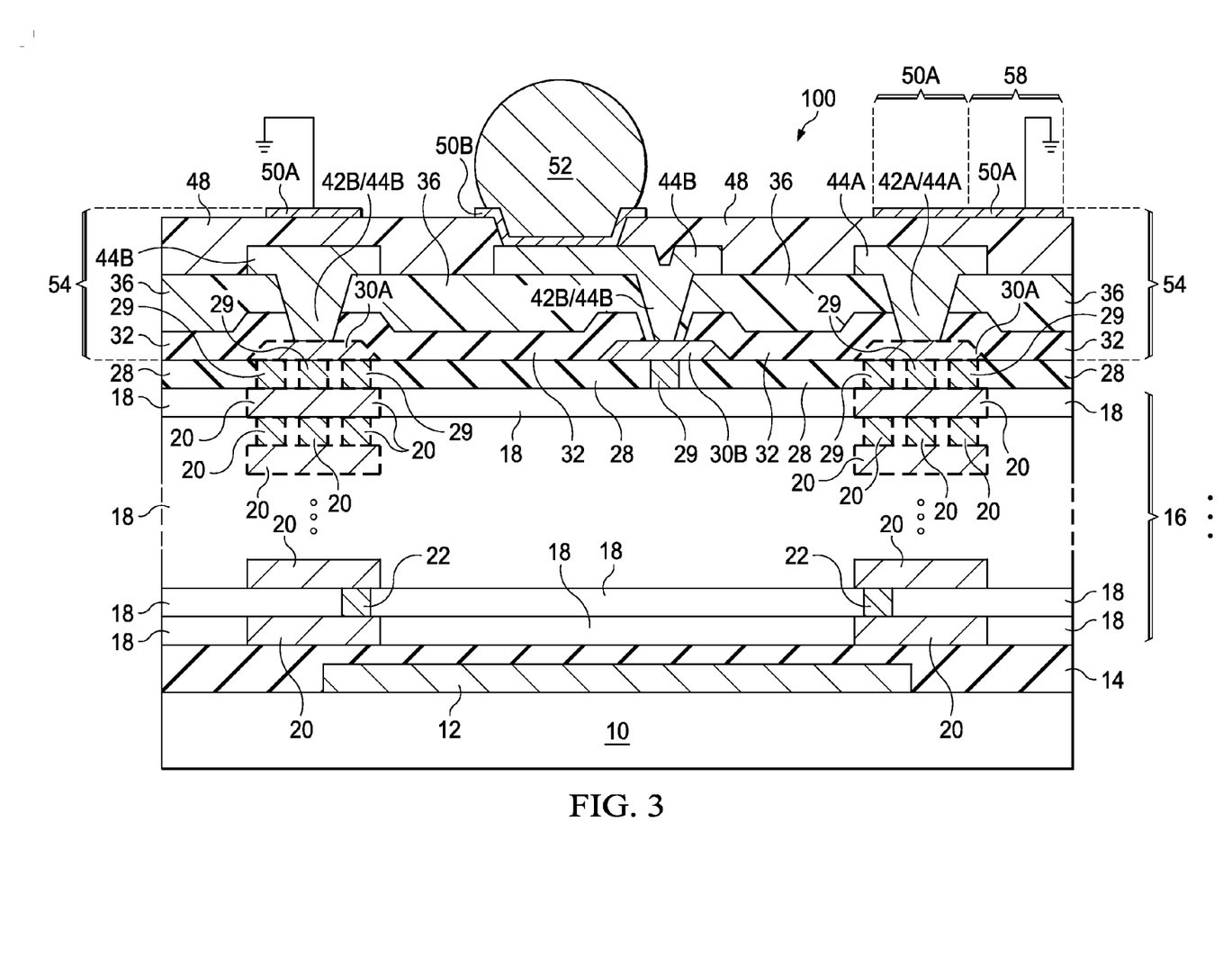

FIG. 3 illustrates the cross-sectional view of guard ring 54 in accordance with yet alternative embodiments, wherein guard ring 54 includes UBM 50A, PPI 44A, and metal pad 30A. In these embodiments, UBM 50A does not extend into polymer layer 48. Instead, an entirety of UBM 50A is over the top surface of polymer layer 48. UBM 50A may form a ring encircling connector 52, UBM 50B, PPI 44B, and metal pad 30B. UBM 50A may be electrically grounded through UBM line 58. In some embodiments, PPI 44A is formed underlying UBM 50A, and forms a part of guard ring 54. UBM 50A in these embodiments, however, is not in physical contact with PPI 44A, although both may be electrically grounded. Again, in these embodiments, metal pad 30A may be formed as a part of guard ring 54, or may not be formed.

Figure 5:
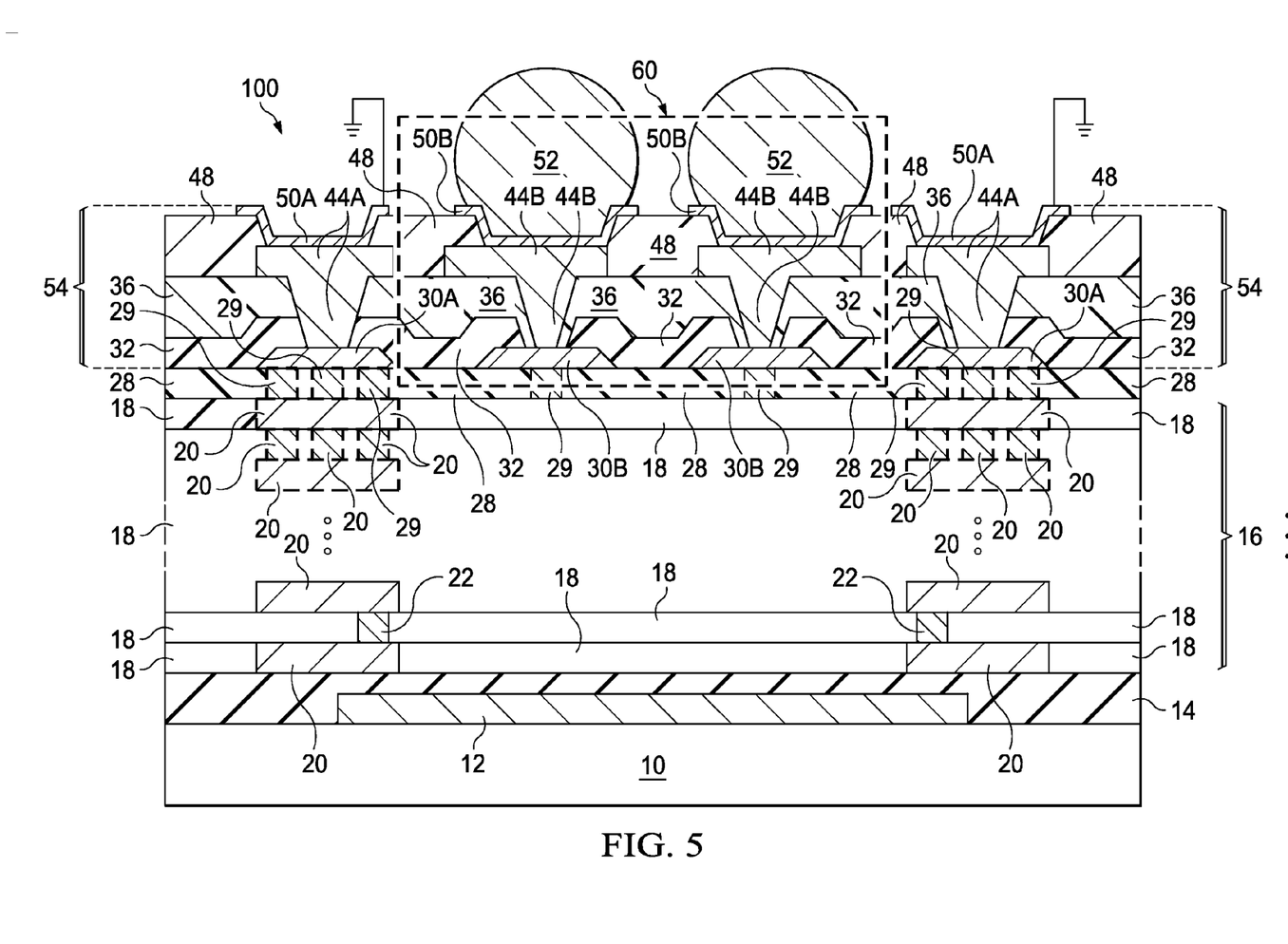
FIGS. 5 through 8 are cross-sectional views and top views of package components in accordance with exemplary embodiments, wherein inductors are encircled by guard rings.
Figure 6:
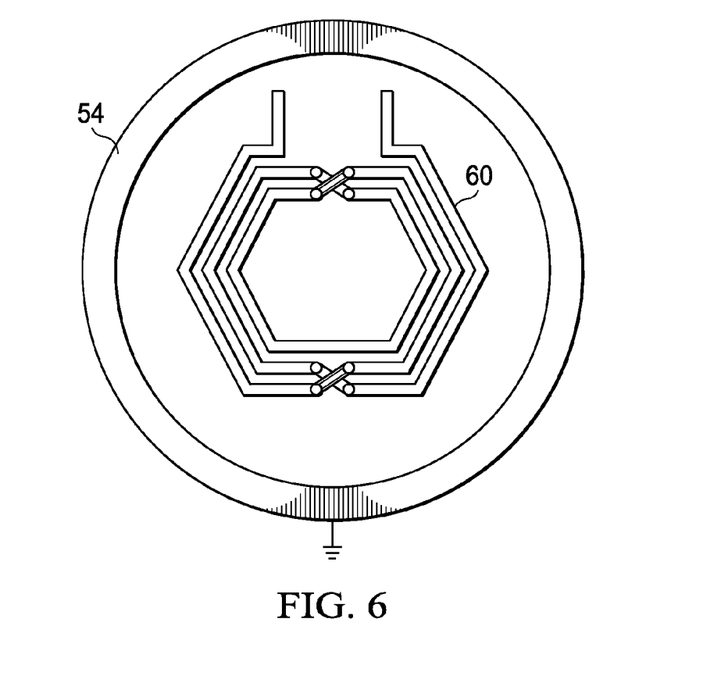

FIGS. 5 and 6 illustrate a cross-sectional view and a top view, respectively, of passive device 60 encircled by guard ring 54. Passive device 60 may be an inductor, a capacitor, a transformer, or the like. Referring to FIG. 5, passive device 60 includes UBM portions 50B, PPI portions 44B, and/or metal pad portions 30B interconnected to function as passive device

60. Guard ring 54 may include one or more of UBM 50A, PPI 44A, and metal pad 30A in any combination. Guard ring 54 is electrically grounded.

FIG. 6 illustrates an exemplary top view of passive device 60. Although an inductor is shown in the illustrative embodiments to represent passive device 60, passive device 60 may also be a capacitor, a transformer, or combination of an inductor, a capacitor, and/or a transformer. Again, in these embodiments, guard ring 54 may be electrically grounded.

Figure 7:
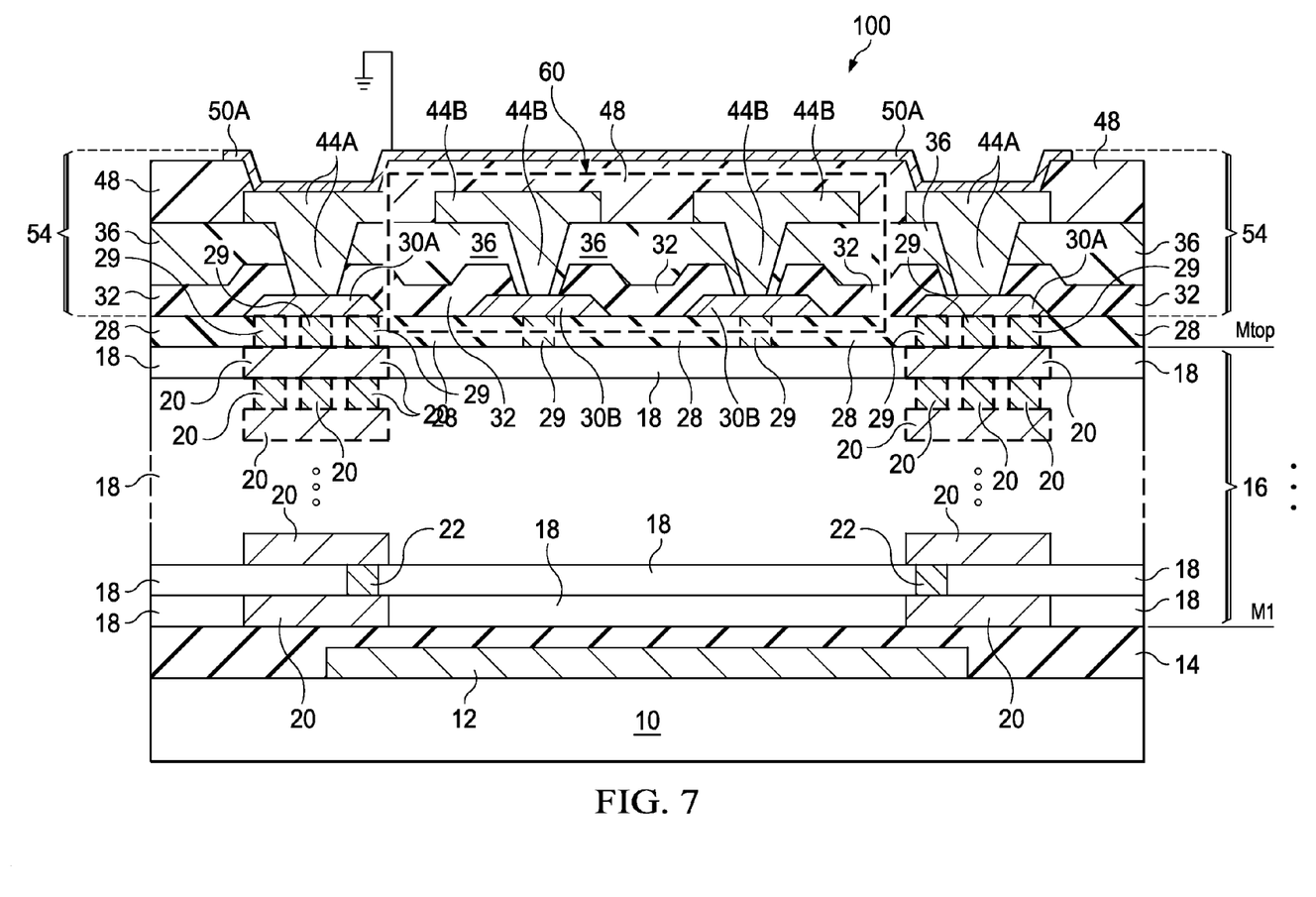
Figure 8:
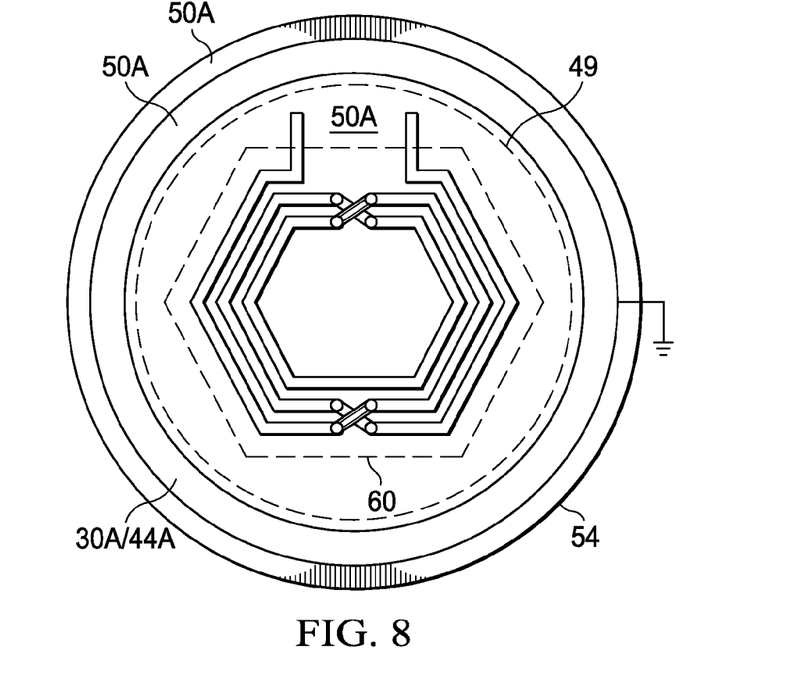

FIGS. 7 and 8 illustrate a cross-sectional view and a top view, respectively, of passive device 60 encircled by guard ring 54. Passive device 60 does extend into the UBM level in these embodiments. UBM 50A may extend directly over passive device 60 and cover passive device 60. UBM 50A, PPI 44A, and metal pad 30A may form a basin, with the opening of the basin facing down. Passive device 60 is disposed in the basin. In some embodiments, UBM 50A forms a solid plate with no opening therein, and the edge portions of UBM 50A extend into polymer layer 48 to contact the ring of PPI 44A. UBM 50A in these embodiments may be treated as including an UBM ring, and a solid UBM plate in the region encircled by the UBM ring, wherein the dashed circle 49 in FIG. 8 symbolizes the interface between the UBM ring and the solid UBM plate. Guard ring 54 may, or may not, include metal pad 30A in these embodiments. Guard ring 54 is electrically grounded. Similar to the embodiments in FIGS. 5 and 6, although an inductor is shown in the illustrative embodiments to represent passive device 60, passive device 60 may also be a capacitor, a transformer, or the combination of an inductor, a capacitor, and/or a transformer. Similar to the embodiments in FIGS. 1 through 6, in these embodiments, guard ring 54 may be electrically grounded.

Figure 9:
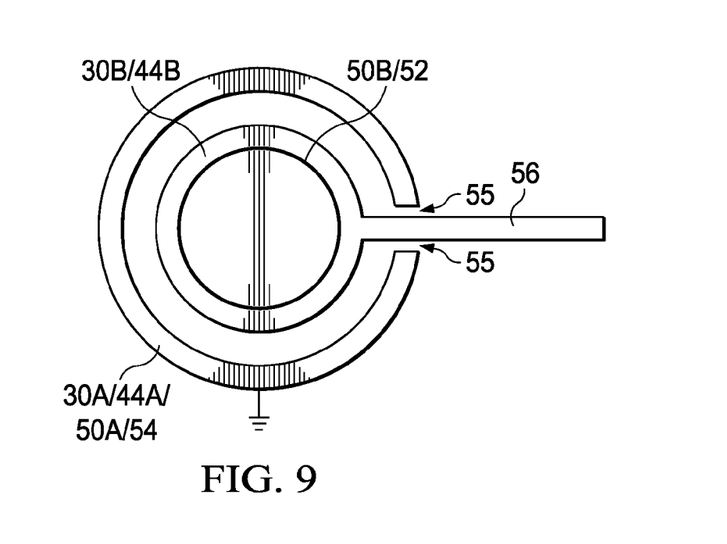
FIGS. 9 and 10 illustrate top views of package components in accordance with exemplary embodiments, wherein guard rings form partial rings.
Figure 10:
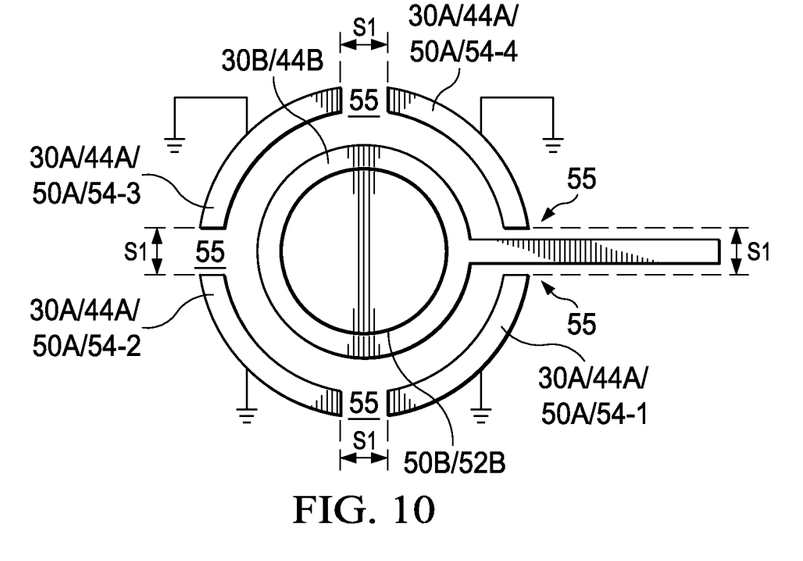

FIGS. 9 and 10 illustrate the top views of guard ring 54 in accordance with alternative embodiments. Referring to FIG. 9, guard ring 54, instead of forming a full ring, forms a partial ring, with break 55 formed in the partial ring. Metal line 56 is connected to an inner structure in the region defined by guard ring 54, which inner structure includes connector 52, UBM 50B, PPI 44B, and/or metal pad 30B. Metal line 56 may be at the same level as PPI 44B or at the same level as metal pad 30B.

Referring to FIG. 10, guard ring 54 may be separated into a plurality of discrete pieces (including 54-1 through 54-4) spaced apart from each other. Each of the pieces may have the same cross-sectional view in either one of FIGS. 1 through 3. Each of pieces 54-1 through 54-4 may be grounded. Spacing S1 between discrete pieces 54-1 through 54-4 may be smaller than the wavelength of the signal passing through the structure encircled by guard ring 54. Although FIGS. 9 and 10 show that connector 52 is in the region encircled by the partial ring 54, passive device 60 (not shown) may also be disposed in the region encircled by the partial ring 54.

In the embodiments, by forming guard rings that are electrically grounded, the signal interference between the structure in the guard rings and outside the guard rings is reduced. The signal integrity is maintained.

In accordance with some embodiments, a structure includes a metal feature, and a passivation layer having a portion overlapping the metal feature. The passivation layer includes a non-low-k dielectric material. A polymer layer is over the passivation layer. A PPI extends into the polymer layer to electrically couple to the metal feature. A guard ring includes a second PPI, wherein the guard ring is electrically grounded. The second PPI substantially encircles the first PPI.

In accordance with other embodiments, a structure includes a metal feature, and a passivation layer having a portion overlapping the metal feature, wherein the passivation layer includes a non-low-k dielectric material. A first polymer layer is disposed over the passivation layer. A first PPI includes a first portion extending into the first polymer layer to electrically couple to the metal feature, and a second portion over the first polymer layer. A second polymer layer is over the first polymer layer. An UBM is over and contacting the first PPI. A connector is over the UBM, wherein the connector is electrically coupled to the metal feature through the first PPI. A guard ring substantially encircles the first PPI, the UBM, and the connector, wherein the guard ring includes a second PPI at a same level as the first PPI, and wherein the second PPI forms a ring.

In accordance with yet other embodiments, a structure includes a metal feature, and a passivation layer including a portion overlapping the metal feature, wherein the passivation layer includes a non-low-k dielectric material. A first polymer layer is over the passivation layer. A passive device includes a first PPI, wherein the first PPI includes a first portion extending into the first polymer layer to electrically couple to the first metal feature, and a second portion over the first polymer layer. A second polymer layer is over the first polymer layer. A guard ring substantially encircles the passive device. The guard ring includes a second PPI at a same level as the first PPI.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising:
   a first metal feature;
   a passivation layer comprising a portion overlapping the first metal feature, wherein the passivation layer comprises a non-low-k dielectric material;
   a first polymer layer over the passivation layer;
   a first Post-Passivation Interconnect (PPI) extending into the first polymer layer to electrically couple to the first metal feature;
   a guard ring comprising a second PPI, wherein the guard ring is electrically grounded, and wherein the second PPI substantially encircles the first PPI; and
   a metal line extending from outside a region encircled by the guard ring to inside the region, wherein the metal line is at a same level as, and is electrically coupled to, the first PPI, and wherein the guard ring forms a partial ring having a break therein, with the metal line extending through the break.

2. The structure of claim 1, wherein the guard ring forms a full ring encircling the first PPI.

3. The structure of claim 1, wherein the guard ring comprises a plurality of discrete pieces, with each of the plurality of pieces electrically grounded.

4. The structure of claim 1 further comprising:
a second polymer layer over the first polymer layer, wherein the guard ring further comprises an Under-Bump Metallurgy (UBM) ring over the second PPI, wherein the UBM ring substantially encircles the first PPI.

5. The structure of claim 4 further comprising:
an UBM plate within a region encircled by in the UBM ring, wherein the UBM plate forms a solid plate with the UBM ring, wherein the UBM plate overlaps the first PPI, and wherein the UBM plate is spaced apart from, and is electrically decoupled from, the first PPI.

6. The structure of claim 1 further comprising:
an UBM over and electrically coupled to the first PPI; and
a connector over and electrically connected to the UBM, wherein the UBM and the connector are substantially encircled by the guard ring.

7. The structure of claim 1, wherein the first PPI is comprised in a portion of a passive device selected from the group consisting essentially of an inductor, a capacitor, a transformer, and combinations thereof.

8. A structure comprising:
a metal feature;
a passivation layer comprising a portion overlapping the metal feature, wherein the passivation layer comprises a non-low-k dielectric material;
a first polymer layer over the passivation layer;
a first Post-Passivation Interconnect (PPI) comprising:
a first portion extending into the first polymer layer to electrically couple to the metal feature; and
a second portion over the first polymer layer;
a second polymer layer over the first polymer layer;
an Under-Bump Metallurgy (UBM) over and contacting the first PPI;
a connector over the UBM, wherein the connector is electrically coupled to the metal feature through the first PPI; and
a guard ring substantially encircling the first PPI, the UBM, and the connector, wherein the guard ring comprises a second PPI at a same level as the first PPI, and wherein the second PPI forms a ring.

9. The structure of claim 8, wherein the guard ring further comprises an UBM ring over the second PPI, wherein the UBM ring substantially overlaps the first PPI.

10. The structure of claim 9, wherein the UBM ring is physically disconnected from the second PPI, and wherein the UBM ring is electrically grounded.

11. The structure of claim 9, wherein the UBM ring physically contacts the second PPI, with an interface between the UBM ring and the second PPI having a ring shape.

12. The structure of claim 8 further comprising a metal ring underlying and contacting the second PPI, wherein the metal ring is at a same level as, and is formed of a same material as, the metal feature.

13. The structure of claim 8, wherein the guard ring is grounded.

14. A structure comprising:
a metal feature;
a passivation layer comprising a portion overlapping the metal feature, wherein the passivation layer comprises a non-low-k dielectric material;
a first polymer layer over the passivation layer;
a passive device comprising a first Post-Passivation Interconnect (PPI), wherein the first PPI comprises:
a first portion extending into the first polymer layer to electrically couple to the metal feature; and
a second portion over the first polymer layer;
a second polymer layer over the first polymer layer; and
a guard ring substantially encircling the passive device, wherein the guard ring comprises:
a second PPI at a same level as the first PPI to form a PPI ring; and
an UBM ring overlapping the PPI ring, with an interface between the UBM ring and the PPI ring forming a ring.

15. The structure of claim 14 further comprising an UBM plate within a region encircled by in the UBM ring and forming a solid plate with the UBM ring, wherein the UBM plate is over the second polymer layer, and is spaced apart from the first PPI.

16. The structure of claim 14 further comprising an UBM extending into the second polymer layer to electrically connect to the passive device, wherein the UBM is encircled by the guard ring.

17. The structure of claim 14, wherein the guard ring is electrically grounded.

18. The structure of claim 14, wherein the passive device is selected from the group consisting essentially of an inductor, a capacitor, a transformer, and combinations thereof.

19. The structure of claim 15 further comprising a solder region in contact with the UBM plate, wherein no solder is in contact with the UBM ring.

20. The structure of claim 6, wherein the connector comprises solder in physical contact with the UBM.

* * * * *